United States Patent
Ko et al.

(10) Patent No.: US 10,925,161 B2
(45) Date of Patent: Feb. 16, 2021

(54) PRINTED CIRCUIT BOARD

(71) Applicant: Samsung Electro-Mechanics Co., Ltd., Suwon-si (KR)

(72) Inventors: Kyung-Hwan Ko, Suwon-si (KR); Jin-Hyun Kim, Suwon-si (KR); Byung-Kuk Kang, Suwon-si (KR); Jung-Hyun Cho, Suwon-si (KR); Chi-Won Hwang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/664,229

(22) Filed: Oct. 25, 2019

(65) Prior Publication Data

US 2020/0196446 A1 Jun. 18, 2020

(30) Foreign Application Priority Data

Dec. 17, 2018 (KR) .................... 10-2018-0163382

(51) Int. Cl.
| | | |
|---|---|---|
| H01G 4/30 | (2006.01) | |
| H05K 1/11 | (2006.01) | |
| H05K 3/46 | (2006.01) | |
| H05K 3/30 | (2006.01) | |

(52) U.S. Cl.
CPC .............. *H05K 1/115* (2013.01); *H01G 4/30* (2013.01); *H05K 3/305* (2013.01); *H05K 3/465* (2013.01); *H05K 3/4697* (2013.01)

(58) Field of Classification Search
CPC . H05K 2201/10515; H05K 2201/1053; H05K 1/182; H05K 1/183; H05K 1/185; H05K 1/115; H05K 3/4697; H05K 3/305; H05K 3/465; H01G 4/40; H01G 4/30; H01G 4/232
USPC ........................................ 361/301.4
See application file for complete search history.

(56) References Cited

U.S. PATENT DOCUMENTS

| | | | | |
|---|---|---|---|---|
| 7,046,200 | B2 * | 5/2006 | Furuya .................... | G04G 21/04 343/700 MS |
| 2007/0145575 | A1 * | 6/2007 | Mori ....................... | H05K 1/023 257/723 |
| 2008/0239685 | A1 * | 10/2008 | Kawabe .................. | H01L 23/50 361/782 |
| 2008/0277150 | A1 * | 11/2008 | Takashima ........... | H01L 21/4857 174/260 |
| 2009/0071705 | A1 * | 3/2009 | Kim ......................... | H01L 24/19 174/262 |
| 2011/0110060 | A1 * | 5/2011 | Togashi ................ | H05K 1/0231 361/782 |
| 2011/0216513 | A1 * | 9/2011 | Lee .......................... | H05K 1/185 361/761 |
| 2012/0014079 | A1 * | 1/2012 | Chen ....................... | H05K 1/181 361/782 |

(Continued)

FOREIGN PATENT DOCUMENTS

| | | |
|---|---|---|
| KR | 10-1018281 B1 | 3/2011 |
| KR | 10-1084252 B1 | 11/2011 |
| KR | 10-1155624 B1 | 6/2012 |

*Primary Examiner* — Roshn K Varghese
(74) *Attorney, Agent, or Firm* — NSIP Law (57) ABSTRACT

A printed circuit board includes: an insulation material including a cavity formed therein; a first electronic element disposed in the cavity and including a groove; and a second electronic element disposed in the groove of the first electronic element.

16 Claims, 9 Drawing Sheets

(56) References Cited

U.S. PATENT DOCUMENTS

| | | | |
|---|---|---|---|
| 2014/0247570 A1* | 9/2014 | Wang | H05K 1/186 |
| | | | 361/760 |
| 2016/0020033 A1* | 1/2016 | Shin | H01G 4/38 |
| | | | 174/260 |
| 2016/0316565 A1* | 10/2016 | Chen | H05K 1/185 |
| 2016/0351333 A1* | 12/2016 | Ando | H01G 4/232 |
| 2017/0169956 A1* | 6/2017 | Miller | H01L 23/48 |
| 2017/0202083 A1* | 7/2017 | Baek | H01L 23/49534 |

* cited by examiner

FIG. 14

PRINTED CIRCUIT BOARD

CROSS-REFERENCE TO RELATED APPLICATION

This application claims the benefit under 35 USC 119(a) of Korean Patent Application No. 10-2018-0163382, filed on Dec. 17, 2018, the entire disclosure of which is hereby incorporated by reference for all purposes.

BACKGROUND

1. Field

The following description relates to a printed circuit board.

2. Description of Background

An amount of data managed by an electronic device increases to realize various functions of the electronic device. As a result, the number of electronic components required in the electronic device has been various and increasing. As the number of electronic components included in the electronic device increases, the number of necessary passive components may also increase.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: an insulation material including a cavity formed therein; a first electronic element disposed in the cavity and including a groove; and a second electronic element disposed in the groove of the first electronic element.

The first electronic element may include a dielectric layer having internal electrodes formed therein and an insulating layer laminated on the dielectric layer, and the groove may pass through the insulating layer.

The groove may expose a surface of the dielectric layer.

The groove may pass through a part of the insulating layer.

The first electronic element may include a pair of external electrodes disposed on a surface of first electronic element, and a width of the groove may be equal to or less than a distance between the pair of external electrodes.

The external electrodes may not overlap the groove in a thickness direction of the printed circuit board.

The printed circuit board may include an adhesive member adhering to the second electronic element disposed on a bottom surface of the groove.

The adhesive member may correspond to an external electrode of the second electronic element.

A thickness of the first electronic element may be greater than a thickness of the second electronic element.

A thickness of the second electronic element may be equal to or greater than a thickness of the groove.

A surface of the second electronic element may protrude from a surface of the insulation material.

The insulation material may include a first layer having the cavity formed therein and a second layer laminated on the first layer, and the first electronic element may be in contact with a surface of the second layer.

The printed circuit board may include a buildup layer laminated on the insulation material and filling the cavity.

The printed circuit board may include: a first via passing through the buildup layer and electrically connected to the first electronic element; and a second via passing through the buildup layer and electrically connected to the second electronic element.

A thickness of the first via may be greater than a thickness of the second via.

The printed circuit board may include: a filling layer filling the cavity; and a buildup layer laminated on the filling layer and the insulation material.

The printed circuit board may include: a circuit disposed on the filling layer; and a via passing through the filling layer and configured to electrically connect the circuit to the first electronic element or the second electronic element.

The printed circuit board may include a through via passing through the insulation material in a thickness direction of the printed circuit board.

The second electronic element may include a plurality of electronic elements.

Other features and aspects will be apparent from the following detailed description, the drawings, and the claims.

BRIEF DESCRIPTION OF THE DRAWINGS

(a) to (f) of FIG. 9 are diagrams illustrating an arrangement of a first electronic element and a second electronic element.

(a) to (d) of FIG. 10 are diagrams illustrating a method for manufacturing a first electronic element.

(a) to (c) of FIG. 11 are diagrams illustrating a method for manufacturing the printed circuit board of FIG. 1.

(a) to (f) of FIG. 12 are diagrams illustrating a method for manufacturing the printed circuit board of FIG. 8.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
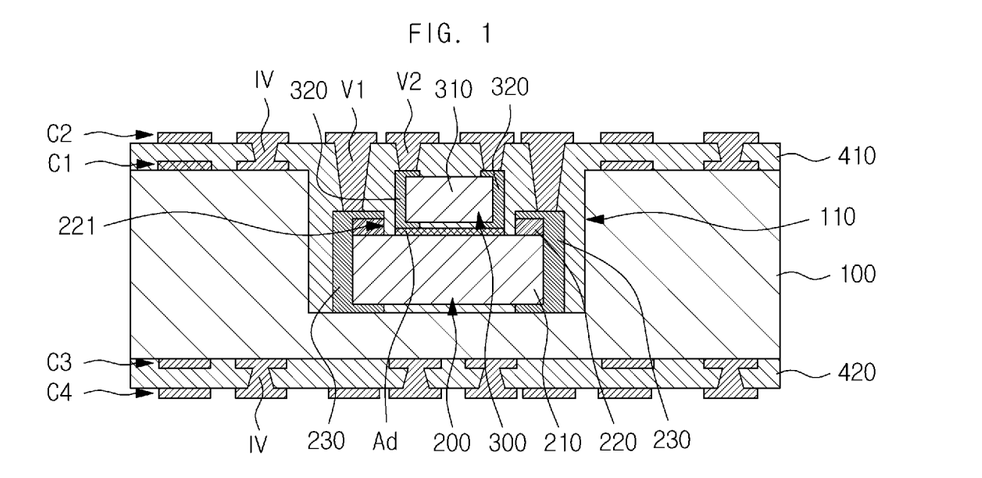
FIG. 1 is a diagram illustrating a printed circuit board according to an example.

FIG. 1 is a diagram illustrating a printed circuit board according to an example.

Referring to FIG. 1, a printed circuit board includes an insulating material 100, a first electronic element 200, and a second electronic element 300.

The insulating material 100 is a plate-like structure made of a nonconductive material. The insulating material 100 may be made of a material including a resin and the resin included in the insulating material 100 may be selected from a variety of thermosetting resins, thermoplastic resins, and the like such as an epoxy resin, a polyimide (PI) resin, a BT resin, a liquid crystal polymer (LCP), or the like. However, the material of the insulating material 100 is not limited thereto. Particularly, the insulating material 100 may be a prepreg (PPG) or an ABF film.

The insulating material 100 may include a fiber reinforcing material or a filler. The fiber reinforcing material may include glass fiber, and the glass fiber may be at least one of a glass filament, a glass fiber, and a glass fabric which are classified depending on thickness. The prepreg may have a structure in which an epoxy resin is impregnated into glass fiber. The filler may be an inorganic filler or an organic filler.

The inorganic filler may be at least one selected from silica ($SiO_2$), alumina ($Al_2O_3$), silicon carbide (SiC), barium sulfate ($BaSO_4$), talc, clay, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$) and calcium zirconate ($CaZrO_3$).

The insulating material 100 has a cavity 110. That is, the cavity 110 opened to an upper surface of the insulating material 100 is formed in the insulating material 100. The cavity 110 may be opened to an upper surface of the insulating material 100, but may not be opened to a side surface thereof. The cavity 110 may partially penetrate the insulating material 100 in a thickness direction, not the entire insulating material 100. The cavity 110 may have a rectangular parallelepiped shape.

The first electronic element 200 may be located within the cavity 110 and may contact a bottom surface of the cavity 110. The first electronic element 200 may be a passive device such as a capacitor. In this case, the first electronic element 200 may be a multi-layer ceramic capacitor (MLCC).

Figure 10:
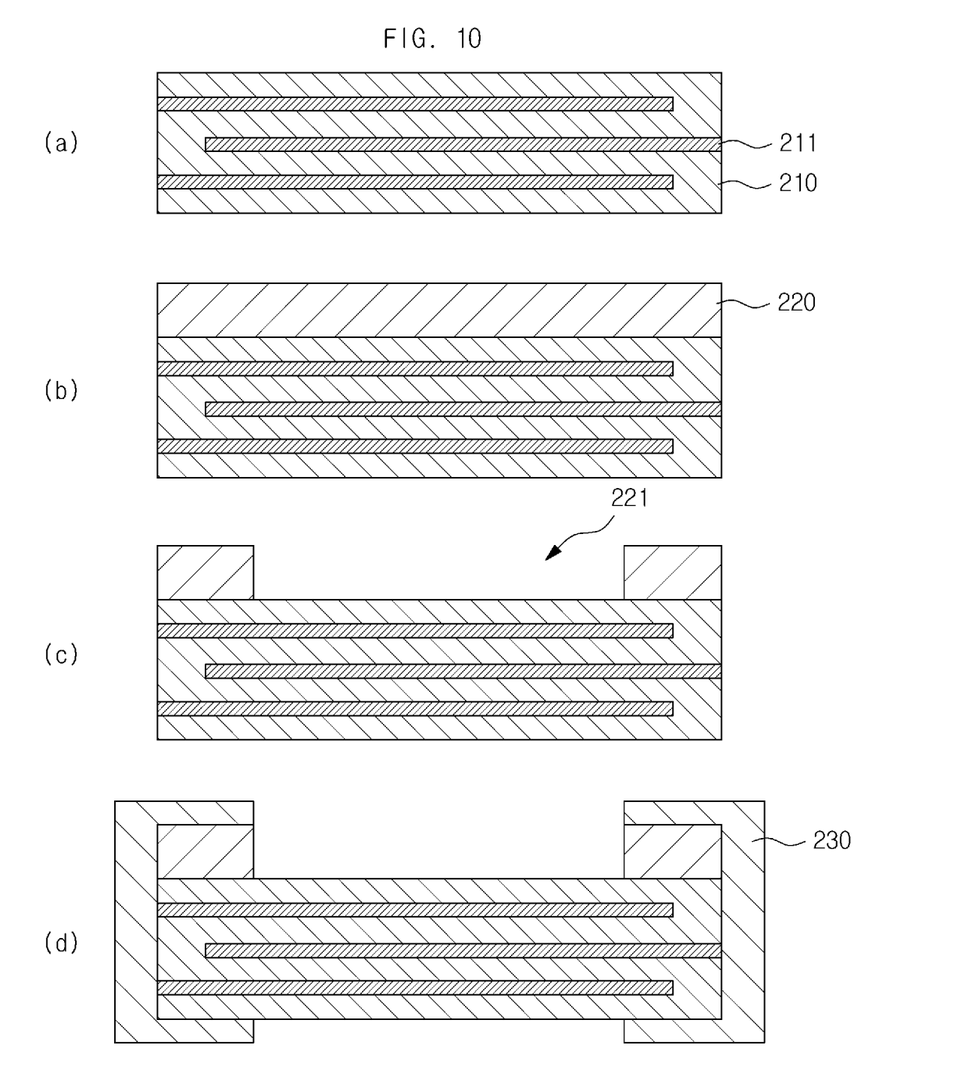

The first electronic element 200 may include a dielectric layer 210 including an internal electrode 211 (211 in (a) to (d) of FIG. 10), an insulating layer 220 stacked on the dielectric layer 210, and an external electrode 230. A groove 221 may be formed on an upper surface of the first electronic element 200.

The dielectric layer 210 may be formed of a ceramic material. The internal electrode 211 is formed in the dielectric layer 210. The dielectric layer 210 may be formed by repeatedly alternately laminating a dielectric sheet and the internal electrode 211. The dielectric sheet may be a ceramic sheet. The internal electrode 211 may be formed of a material including a metal such as nickel (Ni). The internal electrode 211 may be cured after a nickel paste is applied. The internal electrode 211 may include a positive electrode and a negative electrode.

The insulating layer 220 may be laminated on the dielectric layer 210 and may be formed of a material including a resin such as an epoxy resin. A thickness of the insulating layer 220 is less than a thickness of the dielectric layer 210.

The groove 221 may be formed in the insulating layer 220. As shown in FIG. 1, the groove 221 may be formed at the center of the insulating layer 220 and an upper surface of the dielectric layer 210 may be exposed by the groove 221.

A pair of external electrodes 230 may be formed to cover the dielectric layer 210 and the insulating layer 220 and may be electrically connected to the internal electrode 211. When the internal electrode 211 includes a positive electrode and a negative electrode, one of the pair of external electrodes 230 may be connected to the internal electrode 211 of the positive electrode and the other may be connected to the internal electrode 211 of the negative electrode. The external electrode 230 electrically connects the first electronic element 200 to an external structure.

The pair of external electrodes 230 may be spaced apart from each other. The pair of external electrodes 230 may be positioned at both ends of the first electronic element 200 to cover an upper surface of the insulating layer 220, a side surface of the dielectric layer 210 and a bottom surface of the dielectric layer 210.

A width of the groove 221 in the insulating layer 220 may be the same as a distance between the pair of external electrodes 230 and the external electrode 230 may not cover the groove 221.

(a) to (d) of FIG. 10 are diagrams illustrating a method for manufacturing a first electronic element.

Referring to (a) of FIG. 10, a dielectric layer 210 is provided by repeatedly alternately laminating a dielectric sheet and an internal electrode. Here, the dielectric layer 210 may be sintered. The plurality of internal electrodes 211 are arranged to be vertically spaced apart from each other. A part of the plurality of internal electrodes 211 is exposed to one side surface of the dielectric layer 210 to be a positive electrode and the rest is exposed to the other side surface of the dielectric layer 210 to form a negative electrode.

Referring to (b) of FIG. 10, an insulating layer 220 is formed on the dielectric layer 210.

Referring to (c) of FIG. 10, a groove 221 is formed in the insulating layer 220. The groove 221 of the insulating layer 220 may be formed through laser processing, photolithography, or the like.

Referring to (d) of FIG. 10, a pair of external electrodes 230 are formed to surround an upper surface of the insulating layer 220, a side surface of the dielectric layer 210, and a lower surface of the dielectric layer 210. One of the pair of external electrodes 230 is in contact with a positive electrode, and the other is in contact with a negative electrode. The external electrode 230 does not cover the groove 221.

Referring back to FIG. 1, the second electronic element 300 is located within the cavity 110 and is in contact with the first electronic element 200. The second electronic element 300 may be inserted into the groove 221 and formed on or adjacent to the upper surface of the first electronic element 200.

The second electronic element 300 may be a passive device such as a capacitor. The second electronic element 300 may be a multi-layer ceramic capacitor (MLCC). The second electronic element 300 may include a dielectric layer 310 including internal electrodes therein and an external electrode 320 formed on a surface of the dielectric layer 310 to be electrically connected to the internal electrode.

The second electronic element 300 may be inserted into the groove 221 of the insulating layer 220 when the groove 221 is formed in the insulating layer 220 of the first electronic element 200. A lower part of the second electronic element 300 may be surrounded by the insulating layer 220. A thickness of the second electronic element 300 may be equal to or greater than a thickness of the groove 221. The upper surface of the second electronic element 300 may be protruded from the upper surface of the first electronic element 200, but may not be protruded from the upper surface of the cavity 110. The upper surface of the second electronic element 300 may be located on the same plane as the upper surface of the insulating material 100 and the cavity 110.

The second electronic element 300 may not be in contact with the external electrode 230 of the first electronic element 200. Particularly, the external electrode 320 of the second electronic element 300 is spaced apart or isolated from the external electrode 230 of the first electronic element 200.

A size of the second electronic element 300 may be smaller than that of the first electronic element 200. Particularly, a thickness of the second electronic element 300 may be less than a thickness of the first electronic element 200. A width of the second electronic element 300 may be less than a width of the first electronic element 200. A width of the second electronic element 300 may be smaller than a width of the groove 221 of the insulating layer 220.

An adhesive member Ad may be formed on a bottom surface of the groove 221 of the first electronic element 200 to be in contact with the second electronic element 300. As shown in FIG. 1, when the dielectric layer 210 of the first electronic element 200 is exposed through the groove 221 of the insulating layer 220, the adhesive member Ad is formed on an upper surface of the dielectric layer 210 of the first electronic element 200. The adhesive member Ad may be formed corresponding to an area of a lower surface of the second electronic element 300. The adhesive member Ad may be formed of a non-conductive material having adhesiveness.

Figure 9:
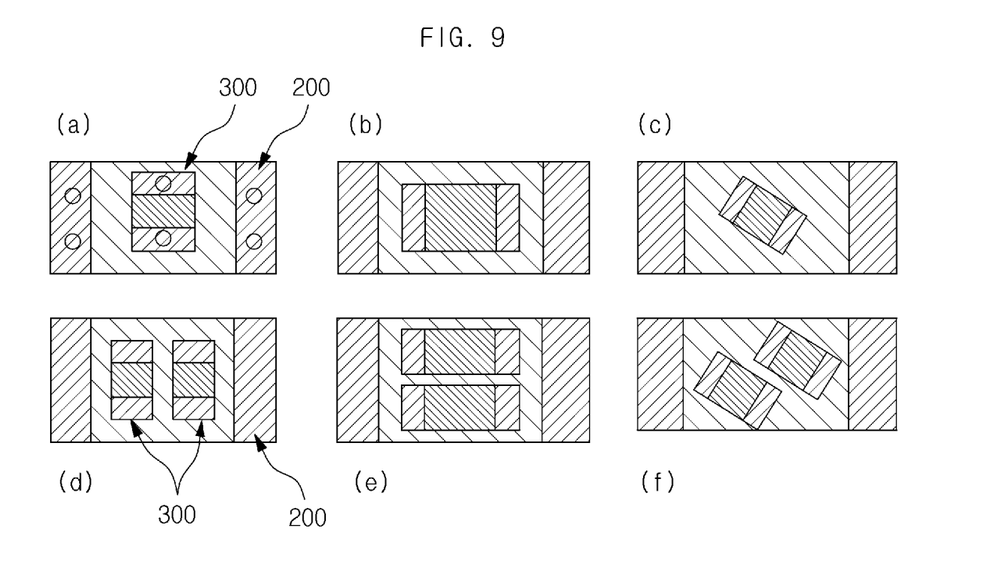

(a) to (f) of FIG. 9 are diagrams illustrating an arrangement of a first electronic element 200 and a second electronic element 300. The first electronic element 200 and the second electronic element 300 are passive elements having the same structure and each of the first electronic element 200 and the second electronic element 300 has a pair of external electrodes at both ends thereof. In each electronic element, a line connecting the pair of external electrodes is referred to as an external electrode connecting line.

As shown in (a) of FIG. 9, the external electrode connecting line of the first electronic element 200 may be perpendicular to the external electrode connecting line of the second electronic element 300. This arrangement is possible when a long width of the second electronic element 300 is less than a short width of the first electronic element 200. In FIG. 9(*a*), a circular mark on the external electrode is a contact portion of a first via V1 or a second via V2.

As shown in (b) of FIG. 9, the external electrode connecting line of the first electronic element 200 may be positioned on the same plane as the external electrode connecting line of the second electronic element 300.

As shown in (c) of FIG. 9, the external electrode connecting line of the first electronic element 200 may be positioned obliquely to the external electrode connecting line of the second electronic element 300.

As shown in (d) to (f) of FIG. 9, the second electronic element 300 may be formed in plural. That is, a plurality of second electronic elements 300 may be located on one first electronic element 200. In this case, the plurality of second electronic elements 300 are inserted into one groove 221 of the first electronic element 200. Alternatively, the groove 221 of the first electronic element 200 may be formed in plural to correspond to the plurality of second electronic elements 300. The second electronic element 300 may be formed of three or more.

An arrangement of the first electronic element 200 and the second electronic element 300 according to (a) to (f) of FIG. 9 may be determined depending on the size of the first electronic element 200 and the second electronic element 300 or the like.

The printed circuit board may further include a buildup layer, a circuit, an inner via IV, a through via PV (see FIGS. 13 and 14), and the like.

The buildup layer may be formed on an upper surface and/or a lower surface of the insulating material 100 and made of a material including a resin. The resin included in the buildup layer may be at least one selected from thermosetting resins, thermoplastic resins and the like, particularly at least one selected from an epoxy resin, a polyimide (PI) resin, a BT resin, a liquid crystal polymer (LCP), or the like. However, the material of the buildup layer is not limited thereto.

The buildup layer may include a fiber reinforcing material or a filler. As a specific buildup layer, a prepreg (PPG) and an ABF film may be used. The buildup layer may be made of the same material as or different from that of the insulating material 100.

The buildup layer on an upper surface of the insulating material 100 may be referred to as a first buildup layer 410 and the buildup layer on a lower surface of the insulating material 100 may be referred to as a second buildup layer 420.

The first buildup layer 410 may be stacked on an upper surface of the insulating material 100 and may fill the cavity 110. Filling the inside of the cavity 110 means that after the first and second electronic elements 200 and 300 are inserted into the cavity 110, the remaining space of the cavity 110 is filled with the first buildup layer 410. By filling the cavity 110 with the first buildup layer 410, the first electronic element 200 and the second electronic element 300 may be fixed.

The second buildup layer 420 may be laminated on a lower surface of the insulating material 100 with the same thickness as the first buildup layer 410. Each of the first buildup layer 410 and the second buildup layer 420 may be formed to be thinner than the insulating material 100.

A circuit provides a path for transmitting an electrical signal and is formed of at least one selected from copper, silver, palladium, aluminum, nickel, titanium, gold, platinum.

A circuit formed on an upper surface of the insulating material 100 may be referred to as a first circuit C1 and a circuit formed on an upper surface of the first buildup layer 410 may be referred to as a second circuit C2. After the first circuit C1 is formed on the upper surface of the insulating material 100, the first buildup layer 410 is formed on the insulating material 100 and the second circuit C2 is formed on the first buildup layer 410. A part of the second circuit C2 may be located on upper surfaces of the first electronic element 200 and the second electronic element 300.

The first circuit C1 and the second circuit C2 may be electrically connected through an inner via IV. The second circuit C2 and the first electronic element 200 may be electrically connected through a first via V1 and the first via V1 may pass through the first buildup layer 410 to be in contact with the external electrode 230 of the first electronic device 200. The second circuit C2 and the second electronic element 300 may be electrically connected through a second via V2 and the second via V2 may pass through the first buildup layer 410 to be in contact with the external electrode 320 of the second electronic element 300. A thickness of the first via V1 may be greater than a thickness of the second via V2. A part of the first via V1 may be located inside the cavity 110.

A circuit formed on a lower surface of the insulating material 100 may be referred to as a third circuit C3 and a circuit formed on an upper surface of the second buildup layer 420 may be referred to as a fourth circuit C4. The third circuit C3 and the fourth circuit C4 may be electrically connected through an inner via IV. Although all the first to fourth circuits C1 to C4 are shown in FIG. 1, some of them may be omitted if necessary.

Figure 13:
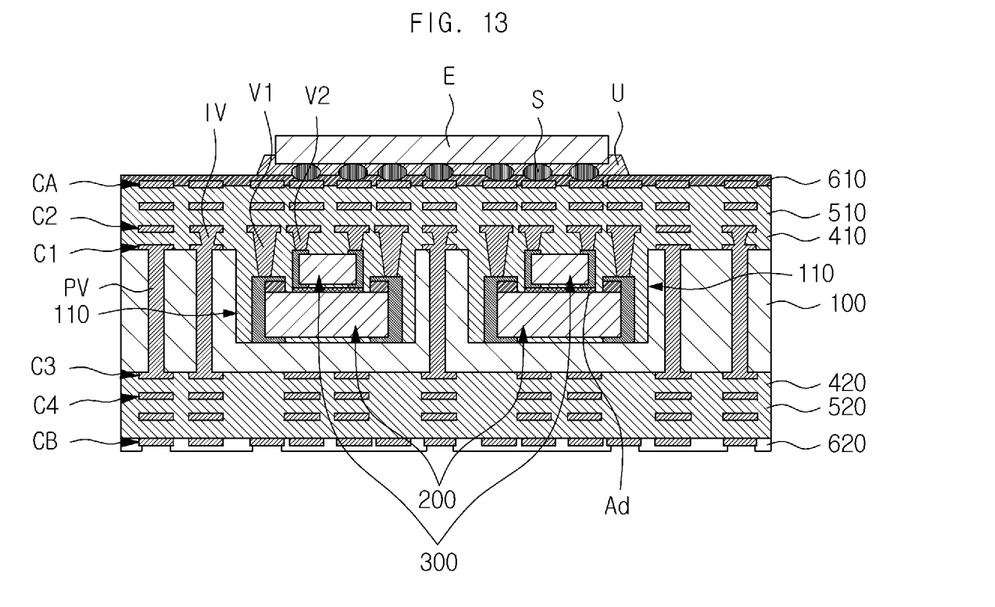
FIG. 13 and FIG. 14 are diagrams illustrating a package using a printed circuit board according to an example.

A through via PV passes through the insulating material 100 to electrically connect the first circuit C1 and the third circuit C3, as shown in FIG. 13.

Each of the first via V1, the second via V2, the inner via IV and the through via PV may be formed of at least one material chosen from copper (Cu), silver (Ag), palladium (Pd), aluminum (Al) nickel (Ni), titanium (Ti), gold (Au), and platinum (Pt), and may be formed of the same metal as the circuit.

FIG. 2 to FIG. 8 are diagrams illustrating printed circuit boards of various examples. Hereinafter, in the description of the various printed circuit boards, description of contents overlapping with the printed circuit board described above may be omitted.

Figure 2:
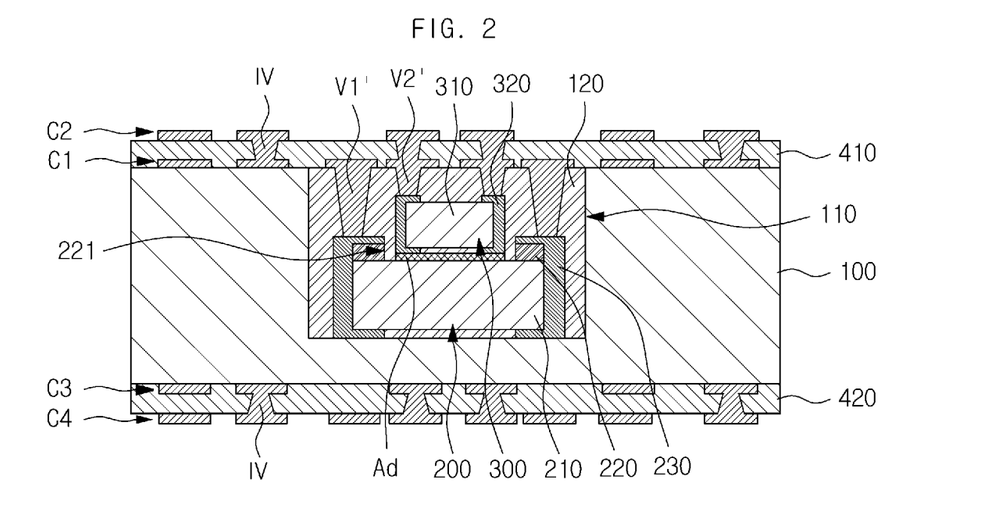
FIG. 2 is a diagram illustrating a printed circuit board according to an example.

Referring to FIG. 2, a printed circuit board includes an insulating material 100, a first electronic element 200, and a second electronic element 300, which are the same as the printed circuit board of FIG. 1.

In this example, the printed circuit board includes a filling layer 120 filling a cavity 110 instead of filling the cavity with a first buildup layer 410. The first buildup layer 410 is formed on upper surfaces of the insulation material 100 and the filling layer 120. The filling layer 120 may be formed of the same material as the first buildup layer 410 and may not be integrated with the first buildup layer 410 to form a bonding interface. The filling layer 120 may also be formed of a material different from a material of the first buildup layer 410. The first electronic element 200 and the second electronic element 300 may be fixed by the filling layer 120.

A total height of the first electronic element 200 and the second electronic element 300 may be less than a height of the cavity 110. An upper surface of the second electronic element 300 may be positioned lower than an upper surface of the insulating material 100.

A first circuit C1 is formed on an upper surface of the insulating material 100 and on an upper surface of the filling layer 120, and the first circuit C1 is electrically connected to the first electronic element 200 and/or the second electronic element 300. That is, a via V1' connecting the first circuit C1 and the first electronic element 200 may be in contact with an external electrode 230 of the first electronic element 200 through the filling layer 120. A via V2' connecting the first circuit C1 and the second electronic element 300 may be in contact with the external electrode 320 of the second electronic element 300 through the filling layer 120. The via V1' for connecting the first circuit C1 to the first electronic element 200 and the via V2' for connecting the first circuit C1 and the second electronic element 300 are all formed inside the cavity 110. A thickness of the via V1' connecting the first circuit C1 and the first electronic element 200 may be greater than a thickness of the via V2' connecting the first circuit C1 and the second electronic element 300.

The first circuit C1 and the second circuit C2 may be electrically connected through an inner via IV. The inner via IV may have a stack via structure with the via V1' connecting the first circuit C1 and the first electronic element 200. The inner via IV may also have a stack via structure with the via V2' connecting the first circuit C1 and the second electronic element 300.

Figure 3:
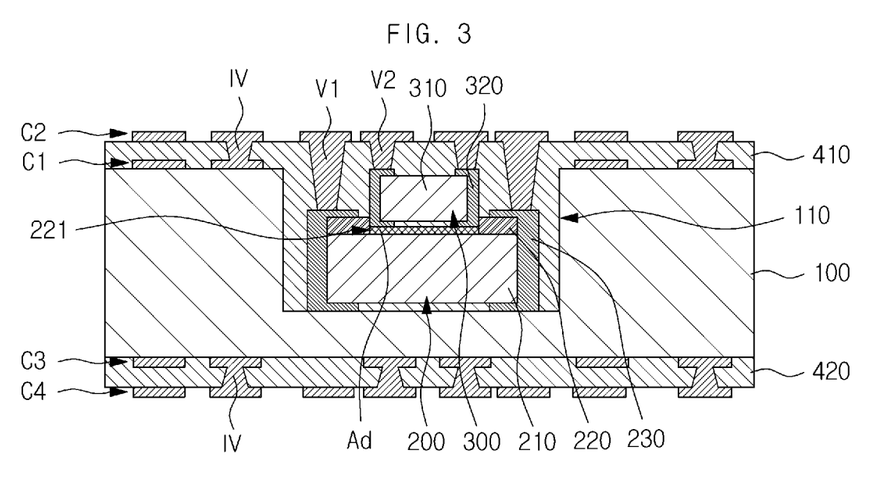
FIG. 3 is a diagram illustrating a printed circuit board according to an example.

Referring to FIG. 3, a printed circuit board includes an insulating material 100, a first electronic element 200, and a second electronic element 300, wherein the first electronic element 200 includes a dielectric layer 210, an insulating layer 220 and an external electrode 230 and the insulating layer 220 has a groove 221 formed therein.

In this example, a width of a groove 221 is smaller than a distance between a pair of external electrodes 230, unlike the printed circuit board of FIG. 1. The groove 221 may be formed at a central portion between the pair of external electrodes 230. A width of the groove 221 may be the same as a width of the second electronic element 300. In this case, a surface of the second electronic element 300 (or the external electrode 320 of the second electronic element 300) may be in contact with the insulating layer 220.

Figure 4:
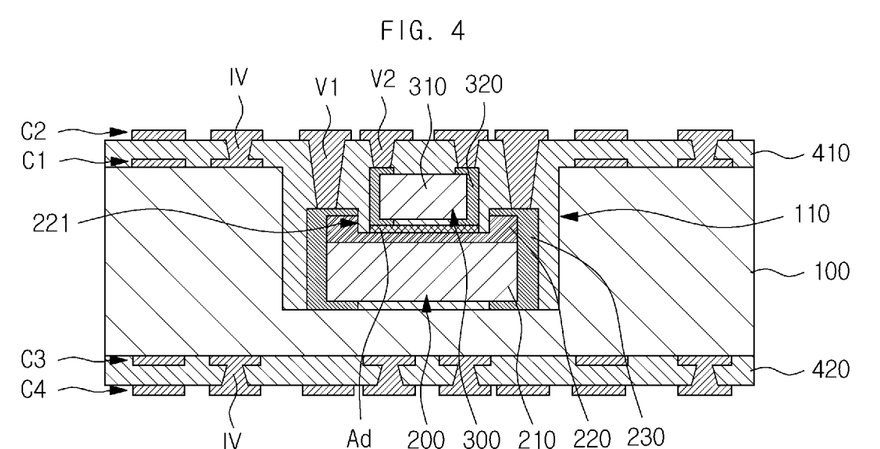
FIG. 4 is a diagram illustrating a printed circuit board according to an example.

Referring to FIG. 4, a printed circuit board includes an insulating material 100, a first electronic element 200, and a second electronic element 300, wherein the first electronic element 200 includes a dielectric layer 210, an insulating layer 220 and an external electrode 230, and wherein the insulating layer 220 has a groove 221 formed therein.

Unlike the printed circuit board of FIG. 1, a thickness of a groove 221 is less than that of the insulating layer 220. In this example, the groove 221 penetrates a part of the thickness of the insulating layer 220. An upper surface of the dielectric layer 210 is not exposed through a bottom surface of the groove 221 and the insulating layer 220 is also formed on the bottom surface of the groove 221. An adhesive member Ad is formed on the insulating layer 220 on the bottom surface of the groove 221.

Figure 5:
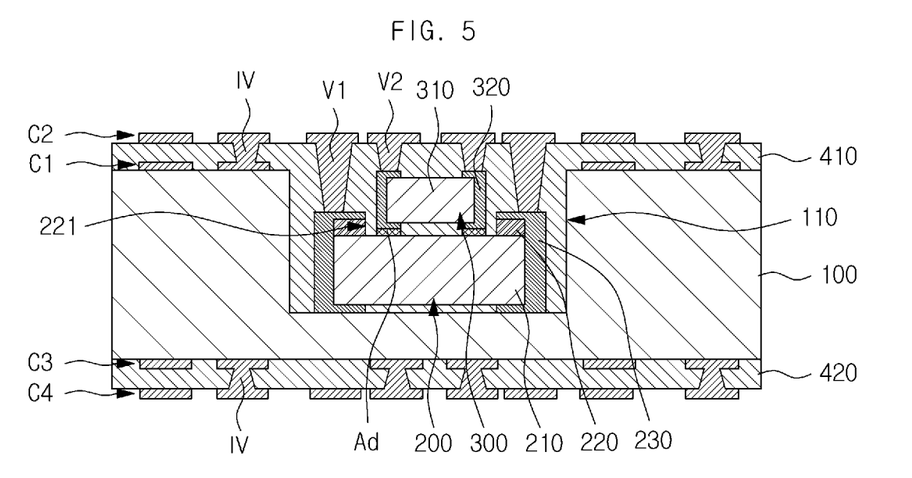
FIG. 5 is a diagram illustrating a printed circuit board according to an example.

Referring to FIG. 5, a printed circuit board includes an insulating material 100, a first electronic element 200, and a second electronic element 300, wherein the first electronic element 200 includes a dielectric layer 210, an insulating layer 220 and an external electrode 230, and wherein the insulating layer 220 has a groove 221 formed therein and an adhesive member Ad is formed on a bottom surface of the groove 221.

In this example, an area of the adhesive member Ad is smaller than that of the printed circuit board in FIG. 1. The adhesive member Ad may be formed to have a smaller area than a lower surface of the second electronic element 300. The adhesive member Ad may be formed corresponding to the external electrode 320 located on a lower surface of the second electronic element 300.

Figure 6:
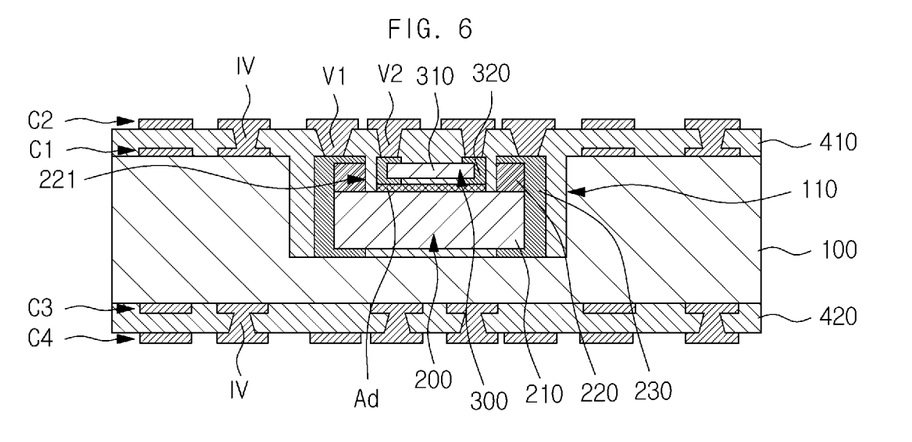
FIG. 6 is a diagram illustrating a printed circuit board according to an example.

Referring to FIG. 6, a printed circuit board includes an insulating material 100, a first electronic element 200, and a second electronic element 300.

In this example, a thickness of the second electronic element 300 may be equal to or less than a thickness of the groove 221. An upper surface of the second electronic element 300 may be located below an upper surface of the first electronic element 200. Particularly, when the upper surface of the second electronic element 300 is located on the same plane as the upper surface of the first electronic element 200, a thickness of a first via V1 electrically connecting the second circuit C2 and the first electronic element 200 may be the same as that of a second via V2 electrically connecting the second circuit C2 and the second electronic element 300. Also, when an upper surface of the second electronic element 300 is located below an upper surface of the first electronic element 200, a thickness of the second via V2 may be greater than the thickness of the first via V1.

Figure 7:
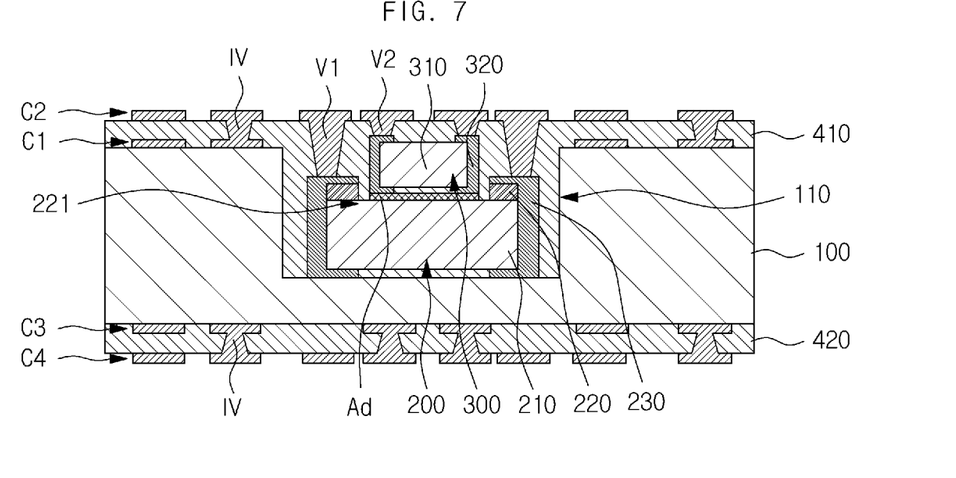
FIG. 7 is a diagram illustrating a printed circuit board according to an example.

Referring to FIG. 7, a printed circuit board includes an insulating material 100, a first electronic element 200, and a second electronic element 300.

In this example, an upper surface of the second electronic element 300 is protruded from an upper surface of a cavity 110. That is, the upper surface of the second electronic element 300 is positioned higher than the upper surface of the insulating material 100. In this case, the upper surface of the second electronic element 300 is located lower than an upper surface of the first buildup layer 410. A thickness of a first via V1 is greater than a thickness of a second via V2 and a part of the first via V1 is located inside the cavity 110, while the entire second via V2 is located on the cavity 110.

Figure 8:
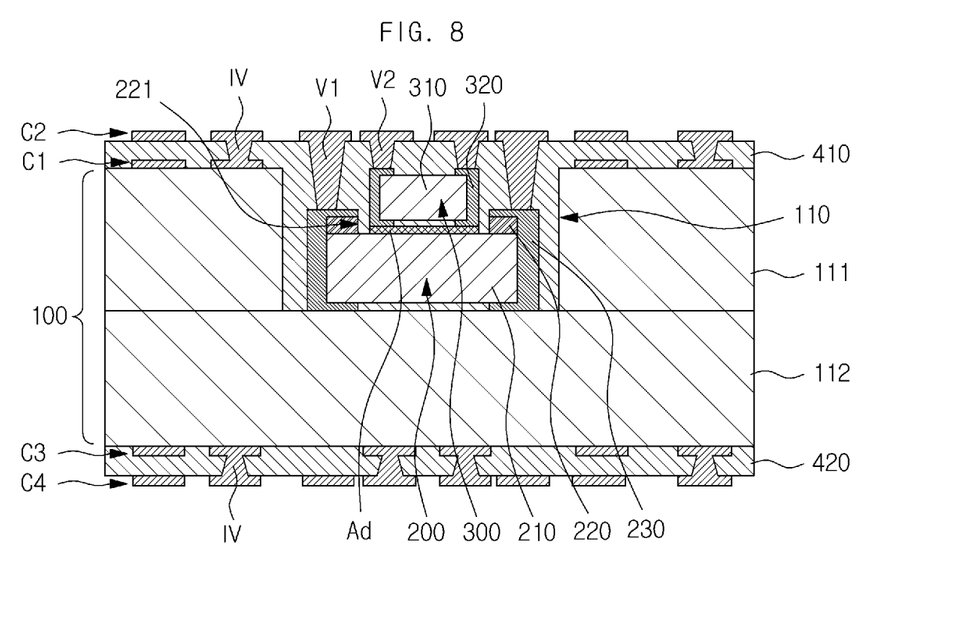
FIG. 8 is a diagram illustrating a printed circuit board according to an example.

Referring to FIG. 8, a printed circuit board includes an insulating material 100, a first electronic element 200, and a second electronic element 300, wherein the insulating material 100 includes a plurality of layers.

The insulating material 100 may include a first layer 111 and a second layer 112. A cavity 110 is formed in the first layer 111 and the cavity 110 is entirely passed through the first layer 111 in a vertical direction. The second layer 112 is laminated under the first layer 111 to expose an upper surface of the second layer 112 through the cavity 110. That is, the first electronic element 200 is in contact with the upper surface of the second layer 112.

The insulating material 100 may include three or more layers. In this case, the cavity 110 may be formed only on one layer, and the other layers may be sequentially stacked on the one layer. Other features other than that the insulating material 100 including a plurality of layers are the same as those described with reference to FIG. 1.

Figure 11:
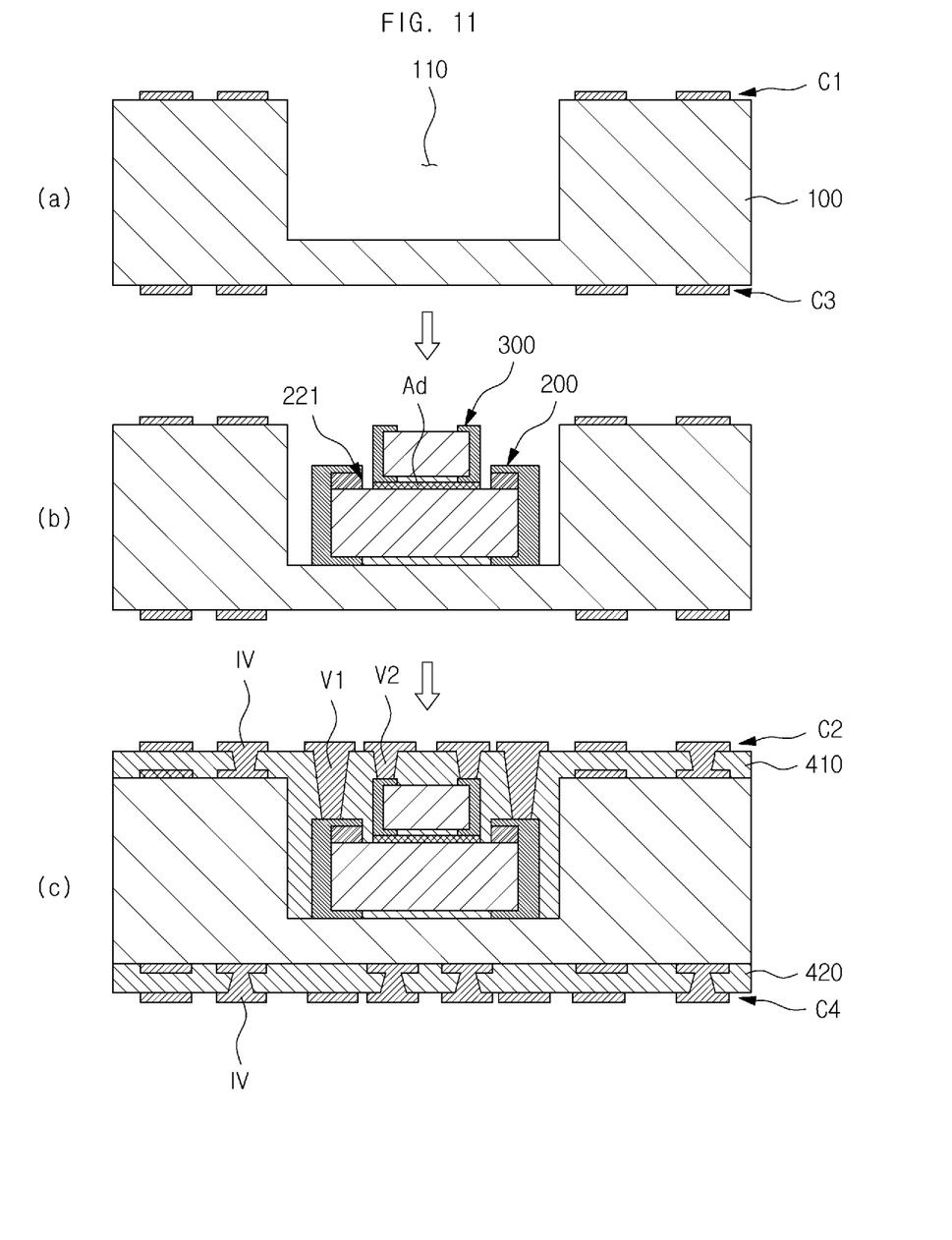

(a) to (c) of FIG. 11 are diagrams illustrating a method for manufacturing the printed circuit board of FIG. 1.

Referring to (a) of FIG. 11, a cavity 110 is formed in an insulating material 100. The cavity 110 penetrates a part of the insulating material 100. A first circuit C1 and a third circuit C3 may be formed on upper and lower surfaces of the insulating material 100, respectively.

Referring to (b) of FIG. 11, a first electronic element 200 and a second electronic element 300 are inserted into the cavity 110. The first electronic element 200 is first inserted and then the second electronic element 300 is inserted into a groove 221 of the first electronic element 200. Alternatively, the second electronic element 300 may be inserted into the cavity 110 after the second electronic element 300 is inserted into the groove 221 of the first electronic element 200.

Referring to (c) of FIG. 11, a first buildup layer 410 is stacked on an upper surface of the insulating material 100, and the first buildup layer 410 may fill up the cavity 110. A second circuit C2 is formed on the first buildup layer 410. The second circuit C2 includes a first via V1 connecting the first electronic element 200 and the second circuit C2 and a second via V2 connecting the second electronic element 300 and the second circuit C2.

An inner via IV is formed in the first buildup layer 410 to connect the first circuit C1 and the second circuit C2. The second buildup layer 420 may be laminated on a lower surface of the insulating material 100. A fourth circuit C4 may be formed in the second buildup layer 420. An inner via IV connecting the third circuit C3 and the fourth circuit C4 is formed in the second buildup layer 420.

Figure 12:
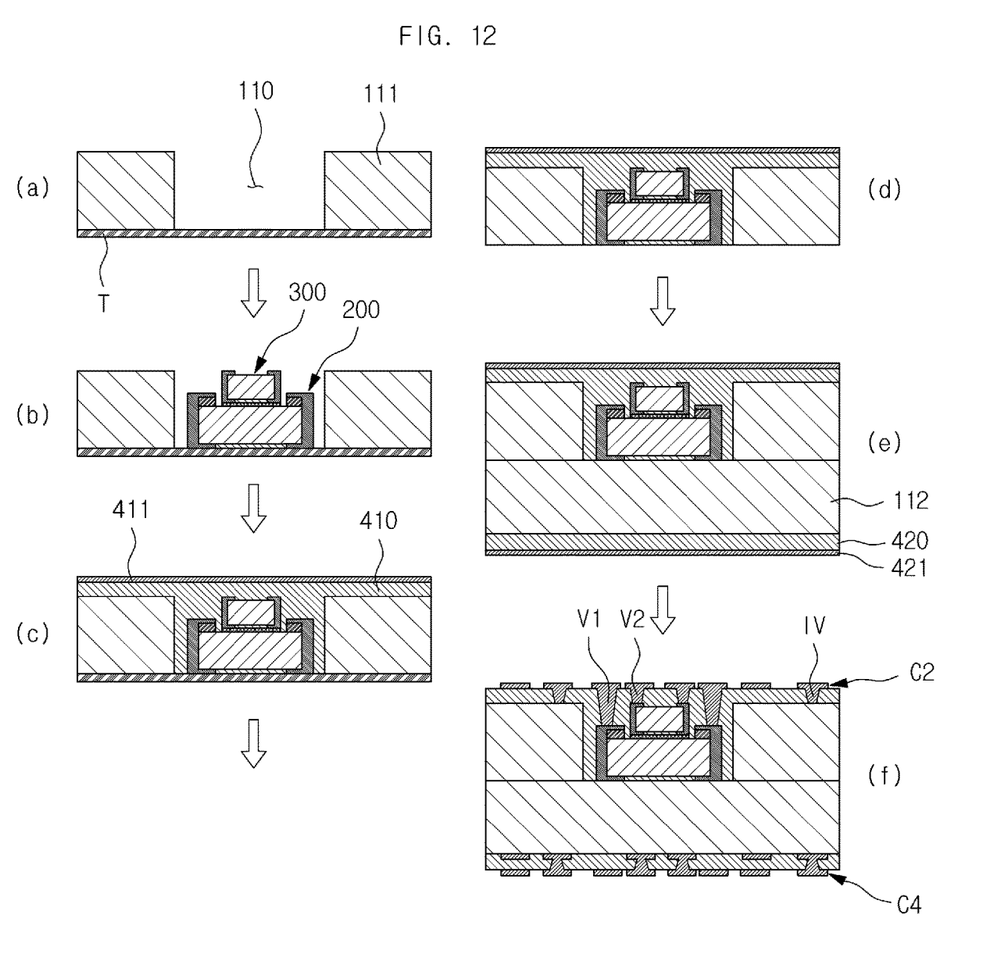

(a) to (f) of FIG. 12 are diagrams illustrating a method for manufacturing the printed circuit board of FIG. 8.

Referring to (a) of FIG. 12, a cavity 110 is formed in a first layer 111 of an insulating material 100, and a tape T is attached to a bottom surface of the first layer 111. The cavity 110 is covered by the tape T. A circuit may be formed on an upper surface of the first layer 111, but it is not shown in the drawing.

Referring to (b) of FIG. 12, a first electronic element 200 and a second electronic element 300 are inserted into the cavity 110. The first electronic element 200 is first inserted and then the second electronic element 300 is inserted into a groove 221 of the first electronic element 200. Alternatively, the second electronic element 300 may be inserted into the cavity 110 after the second electronic element 300 is inserted into the groove 221 of the first electronic element 200. The tape T may support the first electronic element 200.

Referring to (c) of FIG. 12, a first buildup layer 410 including a metal layer 411 is stacked on the first layer 111 and may fill the inside of the cavity 110.

Referring to (d) of FIG. 12, the tape T is removed. The first electronic element 200 and the second electronic element 300 may be fixed by the first buildup layer 410 after the tape T is removed.

Referring to (e) of FIG. 12, a second layer 112 is stacked under the first layer 111 and a second buildup layer 420 including a metal layer 421 is stacked on a lower surface of the second layer 112. A circuit may be formed on a bottom surface of the second layer 112 before the second buildup layer 420 is stacked on the bottom surface of the second layer 112.

Referring to (f) of FIG. 12, the metal layer 411 of the first buildup layer 410 is patterned to become a circuit C2, and the metal layer 421 of the second buildup layer 420 is also patterned to become a circuit C4.

Figure 14:
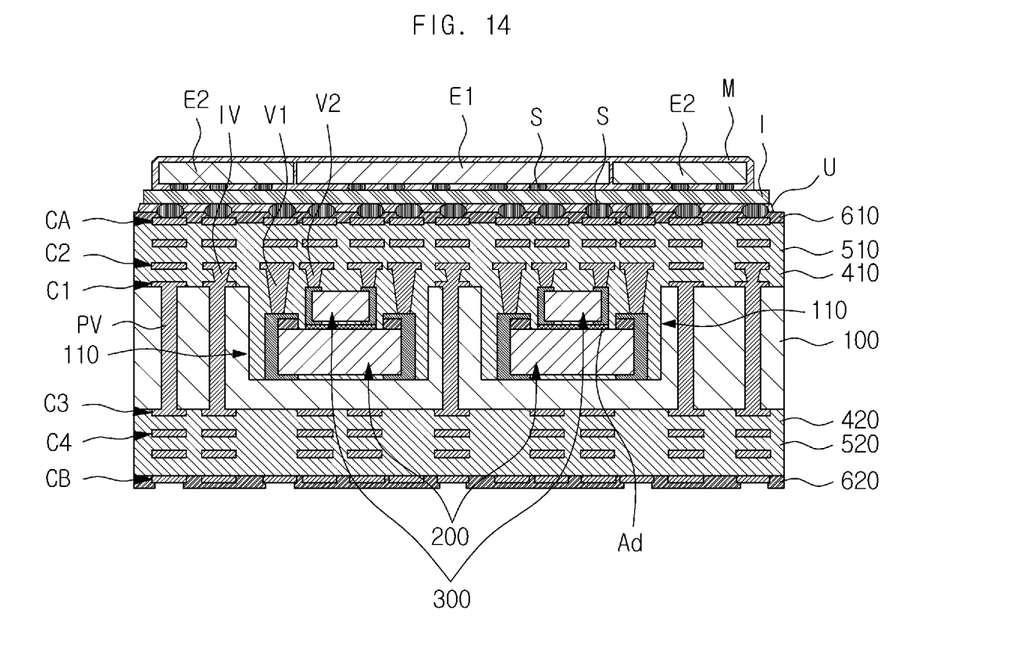

FIG. 13 and FIG. 14 are diagrams illustrating a package using a printed circuit board according to an example.

Referring to FIG. 13, a package may include a printed circuit board on which an electronic component is mounted and an electronic element is embedded on the printed circuit board. The electronic component mounted on the printed circuit board may be an active component, an IC or the like, and a first electronic element 200 and a second electronic element 300 embedded in the printed circuit board may be passive components. Each of the first electronic element 200 and the second electronic element 300 may be formed in plural.

Although the printed circuit board with reference to FIG. 1 is used in the package with reference to FIG. 13 and FIG. 14, any printed circuit board according to the various examples shown in FIG. 2 to FIG. 8 may be applied.

Referring to FIG. 13, a first buildup layer 410 is stacked on an upper surface of an insulating material 100, a second buildup layer 420 is stacked on a lower surface of the insulating material 100, and a plurality of buildup layers 510 may be stacked on the first buildup layer 410, and a plurality of buildup layers 520 may be stacked under the second buildup layer 420. The number of buildup layers may be variously determined as needed. Solder resists 610 and 620 are stacked on the outermost buildup layers. The solder resists 610 and 620 partially expose the outermost circuits CA and CB.

The electronic component E may be flip-chip mounted on the outermost circuit CA exposed by the solder resist 610 with a soldering member S such as solder. An underfill U may be formed in the gap between the electronic component E and the printed circuit board caused by a height of the soldering member S. The electronic component E may be a CPU, but is not limited thereto.

As shown in FIG. 14, a package may include an interposer I. The interposer I is mounted on a printed circuit board, and an underfill U may be formed in a gap below the interposer I.

The interposer I is mounted on the outermost circuit CA exposed by the solder resist 610 with a soldering member S such as solder and a plurality of electronic components E1 and E2 are mounted on the interposer I. The interposer I may be formed of a silicon material. The electronic component E1 may be an application-specific integrated circuit (ASIC), a graphics processing unit (GPU) or the like, and the electronic component E2 may be a high bandwidth memory (HBM), but is not limited thereto. On the other hand, the plurality of electronic components E1 and E2 may be integrally molded on the interposer I by a molding material M such as an epoxy molding compound (EMC).

If this printed circuit board having such electronic elements is used, the parasitic inductance and impedance may be reduced and the power integrity may be increased because a distance between the electronic component and the electronic element is reduced. In addition, since electronic elements are embedded in the printed circuit board, the space occupied by the electronic components on the printed circuit board may be increased. An overall thickness of the package may also be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
an insulation material comprising a cavity formed therein;
a first electronic element disposed in the cavity and
comprising a dielectric layer, an insulating layer disposed on a first surface of the dielectric layer, an external electrode disposed on the insulating layer such that the insulating layer is disposed between the first surface of the dielectric layer and the external electrode, and a groove defined in the insulating layer and the external electrode to expose a portion of the first surface of the dielectric layer;

a second electronic element disposed in the groove on or adjacent to the first surface of the dielectric layer such that a portion of the second electronic element is surrounded by the insulating layer and the external electrode;

a buildup layer laminated on the insulation material and filling the cavity; and a first via passing through the buildup layer and electrically connected to the first electronic element and a second via passing through the buildup layer and electrically connected to the second electronic element, wherein a thickness of the first via is greater than a thickness of the second via.

2. The printed circuit board of claim 1, wherein the dielectric layer comprises internal electrodes formed therein.

3. The printed circuit board of claim 2, wherein the external electrode comprises a pair of external electrodes disposed on the insulating layer, and a width of the groove is equal to or less than a distance between the pair of external electrodes.

4. The printed circuit board of claim 3, wherein the external electrodes do not overlap the groove in a thickness direction of the printed circuit board.

5. The printed circuit board of claim 1, further comprising an adhesive member disposed in the groove and adhering to the second electronic element.

6. The printed circuit board of claim 5, wherein the adhesive member corresponds to an external electrode of the second electronic element.

7. The printed circuit board of claim 1, wherein a thickness of the first electronic element is greater than a thickness of the second electronic element.

8. The printed circuit board of claim 7, wherein a thickness of the second electronic element is equal to or greater than a thickness of the groove.

9. The printed circuit board of claim 1, wherein a surface of the second electronic element protrudes from a surface of the insulation material.

10. The printed circuit board of claim 1, wherein the insulation material comprises a first layer having the cavity formed therein and a second layer laminated on the first layer, wherein the first electronic element is in contact with a surface of the second layer.

11. The printed circuit board of claim 1, further comprising:
a filling layer filling the cavity; and
a buildup layer laminated on the filling layer and the insulation material.

12. The printed circuit board of claim 11, further comprising:
a circuit disposed on the filling layer; and
a via passing through the filling layer and configured to electrically connect the circuit to the first electronic element or the second electronic element.

13. The printed circuit board of claim 1, further comprising a through via passing through the insulation material in a thickness direction of the printed circuit board.

14. The printed circuit board of claim 1, wherein the second electronic element comprises a plurality of electronic elements.

15. A printed circuit board comprising:
an insulation material comprising a cavity formed therein;
a first electronic element disposed in the cavity and comprising a dielectric layer, an insulating layer disposed on a first surface of the dielectric layer, an external electrode disposed on the insulating layer such that the insulating layer is disposed between the first surface of the dielectric layer and the external electrode, and a groove defined in the insulating layer and the external electrode to expose a portion of the first surface of the dielectric layer;
a second electronic element disposed in the groove on or adjacent to the first surface of the dielectric layer such that a portion of the second electronic element is surrounded by the insulating layer and the external electrode,
wherein the external electrode surrounds at least a portion of the first surface of the dielectric layer, a side surface of the dielectric layer, and at least a portion of a second surface of the dielectric layer opposite to the first surface.

16. A printed circuit board comprising:
an insulation material comprising a cavity formed therein;
a first electronic element disposed in the cavity and comprising a first dielectric layer, an insulating layer disposed on a first surface of the first dielectric layer, a first external electrode disposed on the insulating layer such that the insulating layer is disposed between the first surface of the first dielectric layer and the first external electrode, and a groove defined in the insulating layer and the first external electrode to expose a portion of the first surface of the first dielectric layer;
a second electronic element comprising a second dielectric layer and a second external electrode, and disposed in the groove on or adjacent to the first surface of the first dielectric layer such that a portion of the second electronic element is surrounded by the insulating layer and the first external electrode,
wherein the second external electrode surrounds at least a portion of an upper surface of the second dielectric layer, a side surface of the second dielectric layer, and at least a portion of a bottom surface of the second dielectric layer.

* * * * *